(12) United States Patent
Su et al.

(10) Patent No.: US 12,739,980 B2
(45) Date of Patent: Sep. 15, 2026

(54) CONNECTION STRUCTURE FOR YARN WIRE AND CIRCUIT BOARD

(71) Applicant: NEXTRONICS ENGINEERING CORP., New Taipei City (TW)

(72) Inventors: Hou-An Su, Keelung City (TW); Kuan-Wen Chen, New Taipei City (TW)

(73) Assignees: NEXTRONICS ENGINEERING CORP., New Taipei City (TW); MAKALOT INDUSTRIAL CO., LTD., Taipei City (TW)

( * ) Notice: Subject to any disclaimer, the term of this patent is extended or adjusted under 35 U.S.C. 154(b) by 548 days.

(21) Appl. No.: 18/488,048

(22) Filed: Oct. 17, 2023

(65) Prior Publication Data

US 2025/0056736 A1 Feb. 13, 2025

(30) Foreign Application Priority Data

Aug. 9, 2023 (TW) ................................ 112129869

(51) Int. Cl.
*H05K 3/40* (2006.01)
*H05K 3/303* (2026.01)

(52) U.S. Cl.
CPC ........... *H05K 3/4046* (2013.01); *H05K 3/305* (2013.01); *H05K 2203/068* (2013.01)

(58) Field of Classification Search
CPC ................ H05K 3/4046; H05K 3/305; H05K 2203/068; H05K 3/103; H01P 11/003; H01R 13/2414; H01R 43/007; Y10T 29/49124; Y10T 29/49162
See application file for complete search history.

(56) References Cited

U.S. PATENT DOCUMENTS

| | | | | |
|---|---|---|---|---|
| 3,135,935 | A * | 6/1964 | Engelbrecht | H01P 11/003 174/268 |
| 3,646,246 | A * | 2/1972 | Olney, Jr. | H05K 3/222 439/55 |
| 6,350,132 | B1 * | 2/2002 | Glatts, III | H01R 13/2414 29/850 |
| 6,722,896 | B2 * | 4/2004 | McGrath | H01R 43/007 439/271 |

* cited by examiner

*Primary Examiner* — Donghai D Nguyen
(74) *Attorney, Agent, or Firm* — Li & Cai Intellectual Property Office

(57) ABSTRACT

A connection structure includes at least one yarn wire, a back adhesive, and a circuit board. The yarn wire includes a yarn and a metal wire that are helically twisted. The back adhesive is elastic and is in an adhesive gel state when coming in contact with heat. A through hole is formed on the circuit board, and a diameter of the through hole D, a diameter of the yarn wire d, a shrunken diameter of the yarn wire being stretched $d_{min}$, and a jig thickness t of a jig have a relation of: $2d>D>2d_{min}+t$. During assembly, the yarn wire is aligned with the through hole of the circuit board. A portion of the yarn wire is extruded into and passes through the through hole by using the jig, and the portion of the yarn wire forms a protruding wire segment.

10 Claims, 10 Drawing Sheets

CONNECTION STRUCTURE FOR YARN WIRE AND CIRCUIT BOARD

CROSS-REFERENCE TO RELATED PATENT APPLICATION

This application claims the benefit of priority to Taiwan Patent Application No. 112129869, filed on Aug. 9, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a connecting structure of a yarn and a circuit board, and more particularly to a connecting structure that enables a yarn and a circuit board to be connected for electrical signal transmission.

BACKGROUND OF THE DISCLOSURE

A yarn wire is made of a yarn and a metal wire twisted in a helical manner, and has the characteristics of being stretchable and electrically conductive at the same time. The yarn wire can be used as a means of connecting to a device, and the device can then be disposed on a circuit board to form a system that is stretchable and can transfer electrical signals. When the yarn wire is applied to fabrics, signals from various parts of the body can be transmitted to a device hub for processing, without the stretchable properties of the fabric being lost. Generally, the transmission of electrical signals is achieved by welding that includes adding a metal dielectric material between electrical conductors to transmit the electrical signals. However, the yarn itself is not resistant to high temperatures, so that new connection manners need to be developed for the electrical signals to be transmitted under such conditions.

SUMMARY OF THE DISCLOSURE

In response to the above-referenced technical inadequacies, the present disclosure provides a connection structure for a yarn wire and a circuit board so that the yarn wire and the circuit board can be fixed and electrically conductive. Furthermore, the connection structure does not use a solder such that the connection structure can be eco-friendly, and the connection structure can be applied to process a material that is not resistant to high temperatures (such as the temperature of the solder).

In order to solve the above-mentioned problems, one of the technical aspects adopted by the present disclosure is to provide a connection structure for a yarn wire and a circuit board. The connection structure includes at least one yarn wire, a back adhesive, and a circuit board. At least one through hole penetrates two opposite sides of the circuit board. A diameter of the through hole is defined as D, a diameter of the at least one yarn wire is defined as d, a shrunken diameter of the yarn wire being stretched is defined as $d_{min}$, and a jig thickness of a jig is defined as t. The diameter of the through hole, the diameter of the at least one yarn wire, the shrunken diameter of the yarn wire being stretched, and the jig thickness have a relation of: $2d>D>2d_{min}+t$. The yarn wire is arranged on the back adhesive so that the back adhesive is disposed on one side of the yarn wire, and the yarn wire is aligned with the through hole of the circuit board. A portion of the yarn wire is extruded into and passes through the through hole by using the jig, and the portion of the yarn wire that passes through the through hole forms a protruding wire segment that is expanded and is in a shape of a round loop. A fixing back adhesive is adhered to one side of the circuit board, and the fixing back adhesive is adhered to the circuit board and the protruding wire segment so that the yarn wire and the circuit board are connected and fixed to each other.

In one of the possible or preferred embodiments, the diameter of the yarn wire ranges from 0.5 mm to 0.7 mm, and the shrunken diameter of the yarn wire being stretched ranges from 0.2 mm to 0.4 mm.

In one of the possible or preferred embodiments, the yarn wire and the back adhesive form a yarn wire group, and two yarn wire groups are able to be bonded by being in contact with each other through the back adhesive, such that the yarn wires of the two yarn wire groups are able to be electrically conductive by contacting with each other.

Therefore, in the connection structure for a yarn wire and a circuit board, the connection structure includes a yarn wire, a back adhesive, and a circuit board. A through hole is formed on the circuit board, and a diameter of the through hole D, a diameter of the yarn wire d, the shrunken diameter of the yarn wire being stretched $d_{min}$, and a jig thickness t of a jig have a relation of: $2d>D>2d_{min}+t$. During assembly, the yarn wire together with the back adhesive are aligned with the through hole of the circuit board. A portion of the yarn wire is extruded into and passes through the through hole by using the jig, and the portion of the yarn wire that passes through the through hole forms a protruding wire segment that is expanded and is in a shape of a round loop. The yarn wire applies a frictional force and an abutting normal force on an inner wall of a periphery of the through hole. The protruding wire segment that is expanded can prevent the yarn wire from being pulled out together with the jig. The fixing back adhesive is adhered to the circuit board and the protruding wire segment and enables the protruding wire segment to be more robust and difficult to be pulled out. Therefore, the yarn wire and the circuit board are connected and fixed to each other. The connection structure of the present disclosure allows the yarn wire and the circuit board to be fixed and electrically conductive. Furthermore, the connection structure does not use a solder such that the connection structure can be eco-friendly, and the connection structure can be applied to process a material that is not resistant to high temperatures.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
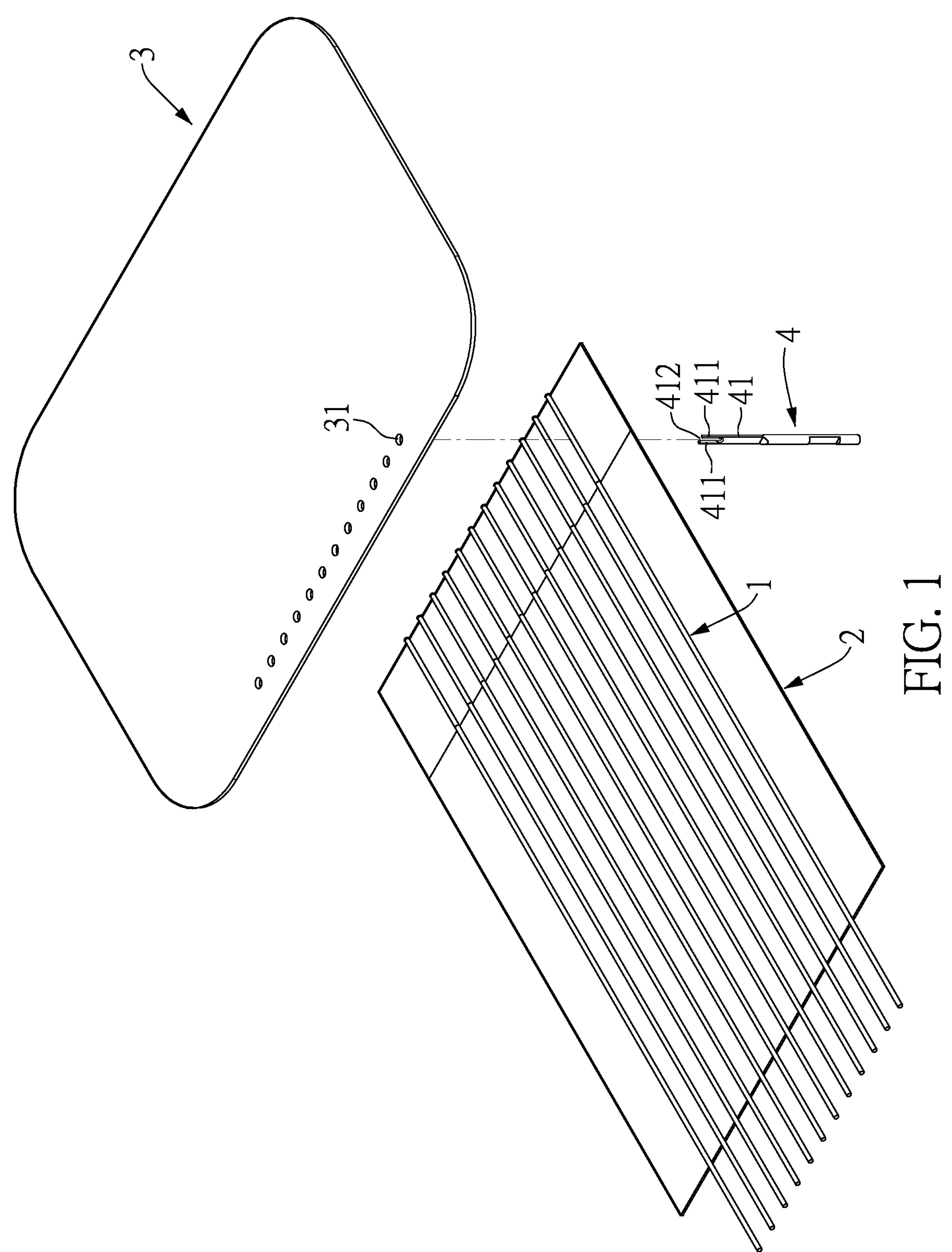
FIG. 1 is a perspective exploded view of a connection structure for a yarn wire and a circuit board according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Embodiment

Figure 2:
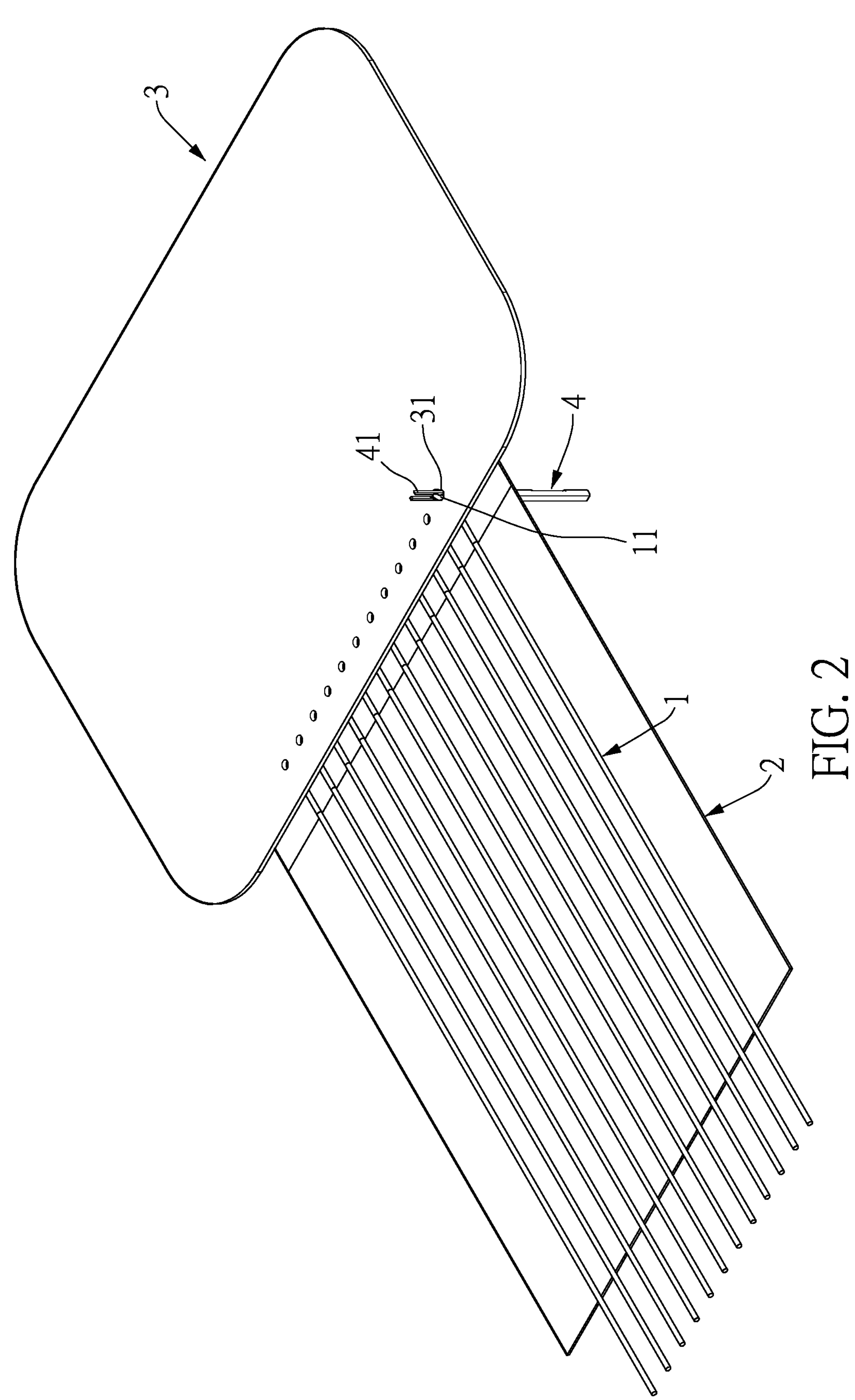
FIG. 2 is a perspective view of the connection structure for a yarn wire and a circuit board according to the present disclosure.
Figure 3:
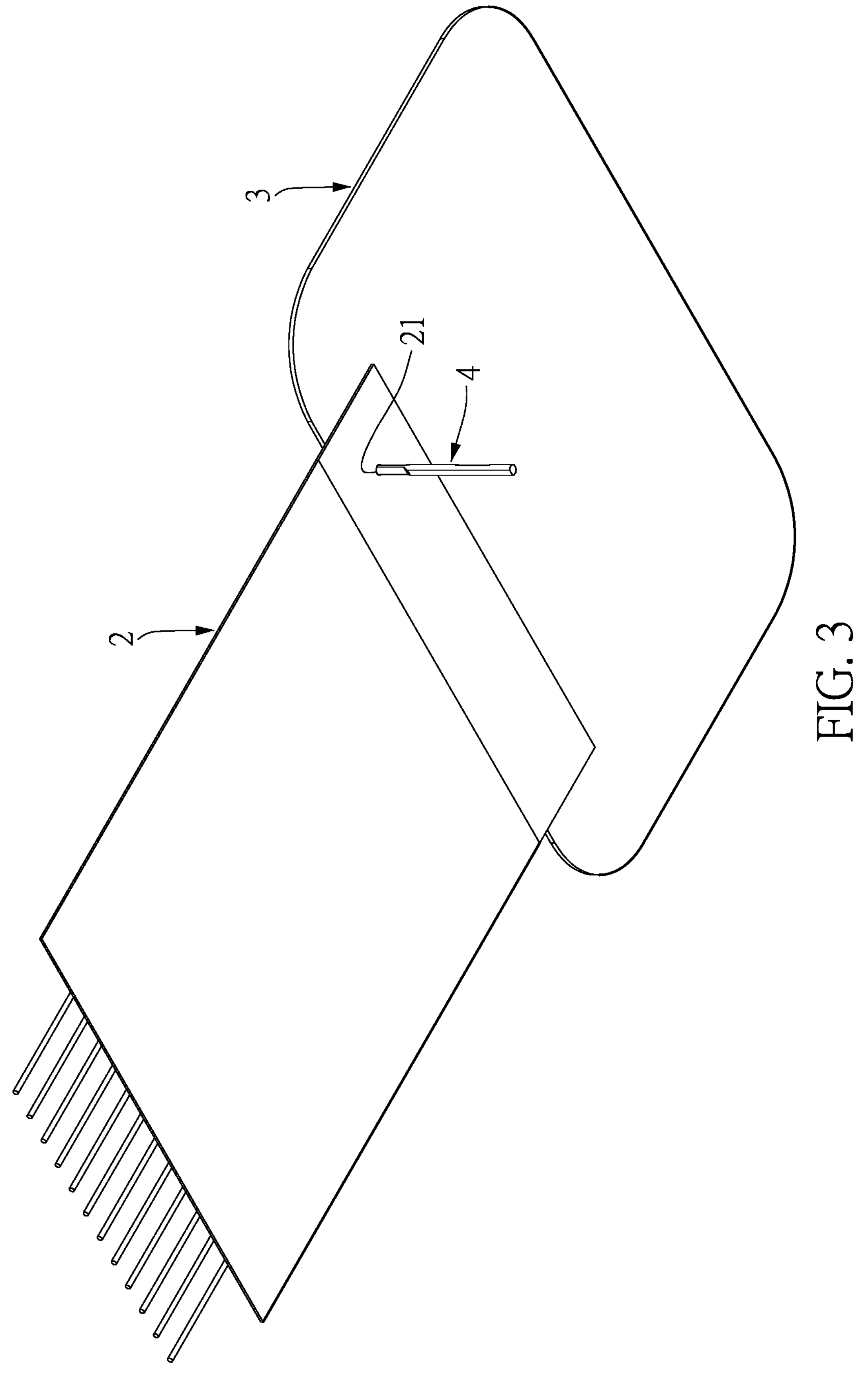
FIG. 3 is another perspective view of the connection structure for a yarn wire and a circuit board according to the present disclosure.

Referring to FIG. 1 to FIG. 3, the present disclosure provides a connection structure for a yarn wire and a circuit board. The connection structure includes at least one yarn wire 1, a back adhesive 2, and a circuit board 3. The yarn wire 1 includes a yarn and a metal wire (not shown in the figures) that are helically twisted together. The yarn wire 1 is a stretchable and electrically conductive yarn wire structure that has properties of being stretchable and electrically conductive. Since the yarn wire is an existing technology and the present disclosure does not limit a structure of the yarn wire 1, the structure of the yarn wire 1 will not be described in detail herein. A quantity of the yarn wire 1 is not limited, and a quantity of the yarn wire 1 can be one or more. In this embodiment, a plurality of yarn wires 1 are provided to allow for greater signal transmission. The yarn wires 1 are spaced apart from each other.

The back adhesive 2 is elastic, and the back adhesive 2 is in a gel state and becomes sticky when coming in contact with heat, such that the back adhesive 2 can be bonded with the yarn wires 1 for being press-printed on fabrics. Therefore, the fabrics can provide an electrical signal transmission function while maintaining the stretchable characteristic.

Figure 4:
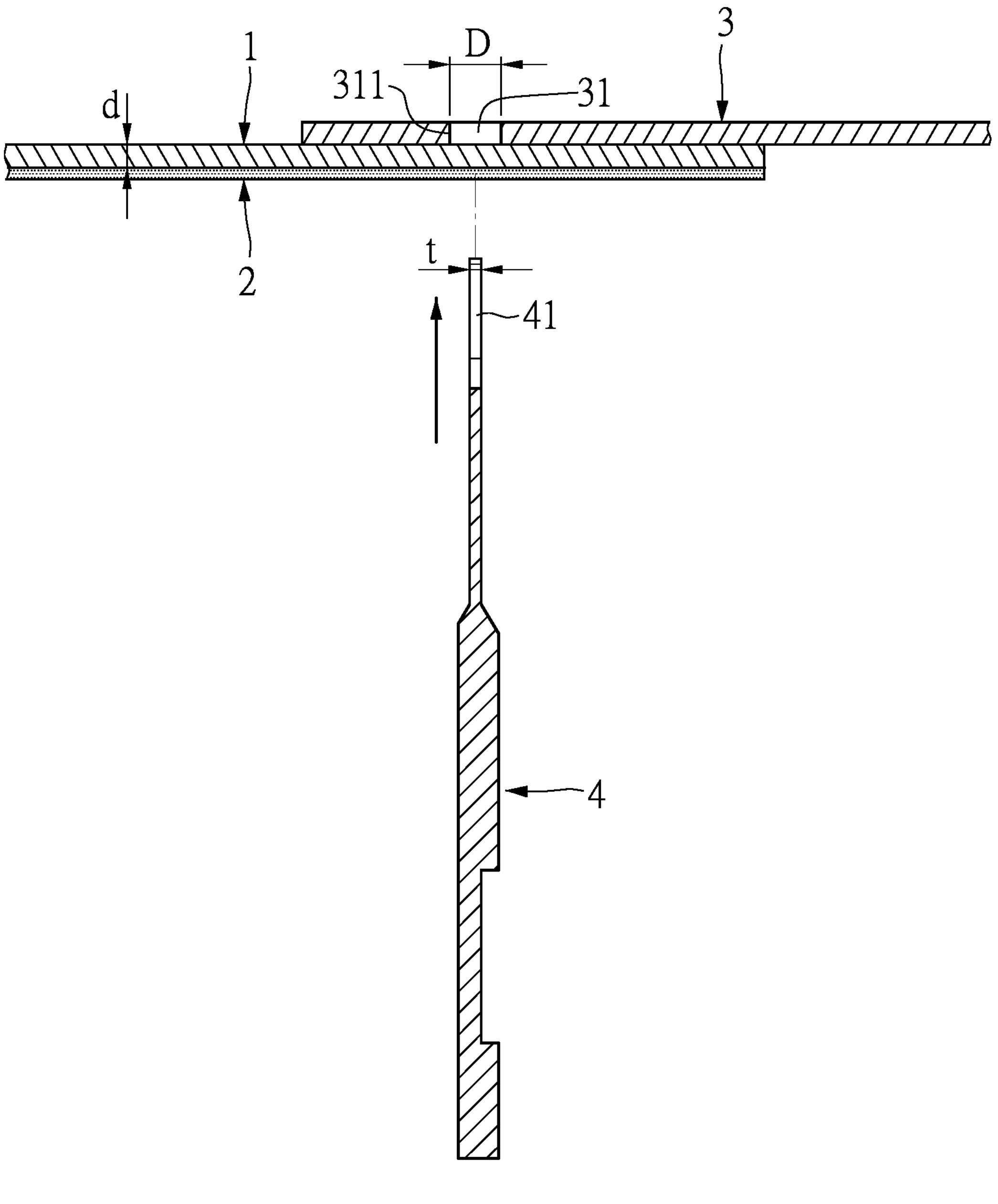
FIG. 4 is a schematic assembly view of the connection structure for a yarn wire and a circuit board according to the present disclosure.
Figure 5:
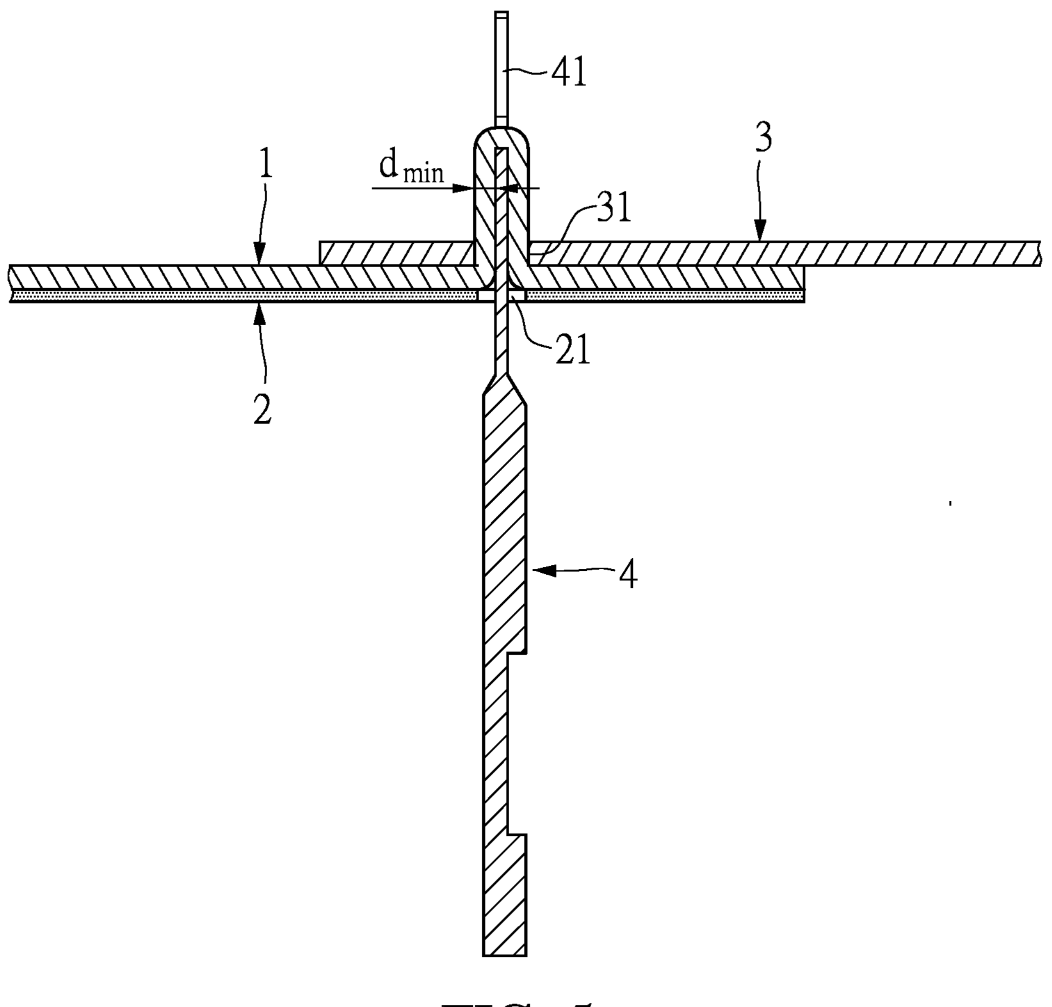
FIG. 5 is another schematic assembly view of the connection structure for a yarn wire and a circuit board according to the present disclosure.

The circuit board 3 can be a flexible or a rigid circuit board. At least one through hole 31 is formed on the circuit board 3. The through hole 31 is a circular hole, and the through hole 31 penetrates through two opposite sides of the circuit board 3. A number of the through hole 31 is not limited, and the number of the through hole 31 can be one or more. Multiple through holes 31 are formed in this embodiment, and the through holes 31 are spaced apart from each other and respectively correspond with the yarn wires 1. The through holes 31 can be arranged in one row to facilitate connection with the yarn wires 1 and fixing the yarn wires 1 in place. A diameter of the through hole 31 is defined as D (as shown in FIG. 4), a diameter of the at least one yarn wire 1 is defined as d, a shrunken diameter of the yarn wire 1 being stretched is defined as $d_{min}$ (as shown in FIG. 5), and a jig thickness (as shown in FIG. 4) of a jig 4 is defined as t. The diameter of the through hole 31, the diameter of the at least one yarn wire 1, the shrunken diameter of the yarn wire 1 being stretched, and the jig thickness have a relation of: $2d>D>2d_{min}+t$. The present disclosure provides an optimal correspondence between the diameter d of the at least one yarn wire 1, the shrunken diameter $d_{min}$ of the yarn wire 1 being stretched, and the diameter D of the through hole 31. Preferably, the diameter d of the yarn wire 1 ranges from 0.5 mm to 0.7 mm, and more preferably is 0.6 mm, and the shrunken diameter $d_{min}$ of the yarn wire 1 being stretched ranges from 0.2 mm to 0.4 mm, and more preferably is 0.3 mm. Therefore, the yarn wire 1 and the circuit board 3 can be smoothly connected and fixed to each other, and have a steady connection therebetween, but the present disclosure is not limited thereto.

During assembly, the yarn wire 1 can be arranged on the back adhesive 2 (as shown in FIG. 4). At this time, the back adhesive 2 is disposed on one side of the yarn wire 1, and the yarn wire 1 having the back adhesive 2 is aligned with the through hole 31 of the circuit board 3. A portion of the yarn wire 1 can be extruded into and passes through the through hole 31 by using the jig 4 to penetrate the back adhesive 2 (as shown in FIG. 5). At least one perforation 21 can be formed on the back adhesive 2, and the perforation 21 corresponds to the through hole 31. The perforation 21 allows the jig 4 to penetrate the back adhesive 2, and the perforation 21 can be formed when the jig 4 penetrates the back adhesive 2, or formed beforehand. A diameter of the yarn wire 1 is decreased as the yarn wire 1 is stretched. The shrunken diameter of the yarn wire 1 being stretched is defined as $d_{min}$. In this way, the yarn wire 1 can more easily pass through the through hole 31 to facilitate a fast assembly.

In this embodiment, one end of the jig 4 has a holding portion 41. The holding portion 41 is bifurcated and can be used to quickly hold the yarn wire 1 to extrude the yarn wire 1 into the through hole 31, and the holding portion 41 can also be rapidly separated from the yarn wire 1. Preferably, the holding portion 41 includes two holding bars 411 (as shown in FIG. 1), and a retaining groove 412 is formed between the two holding bars 411. The retaining groove 412 can be used to accommodate the yarn wire 1, so that the two holding bars 411 can be used to hold the yarn wire 1, thereby allowing the holding portion 41 to quickly hold the yarn wire 1 or be quickly separated from the yarn wire 1. The circuit board 3 can be partially laminated with the back adhesive 2 such that the circuit board 3 is bonded by adhesion to the back adhesive 2 to have an improved fixing effect.

Figure 6:
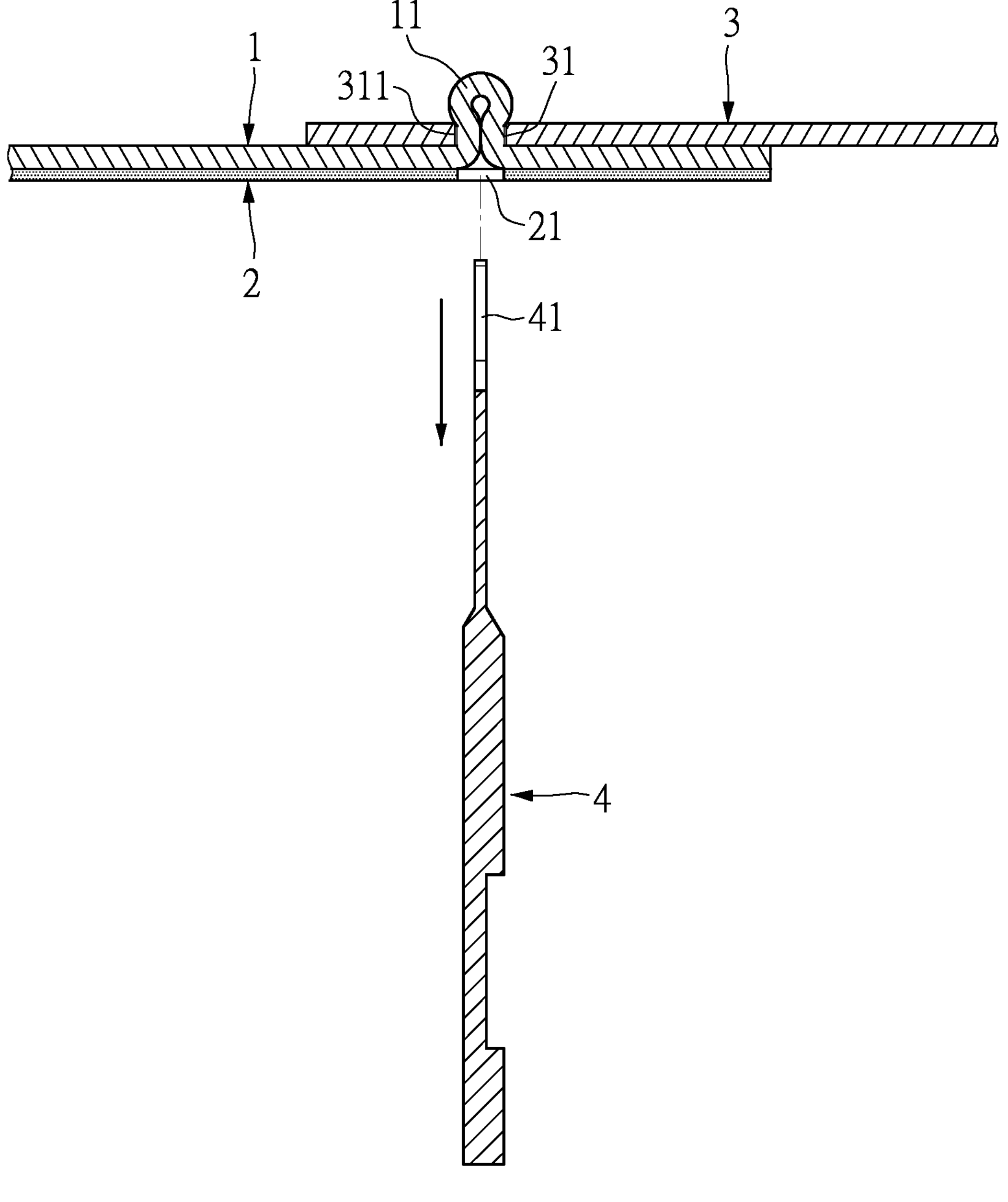
FIG. 6 is yet another schematic assembly view of the connection structure for a yarn wire and a circuit board according to the present disclosure.
Figure 7:
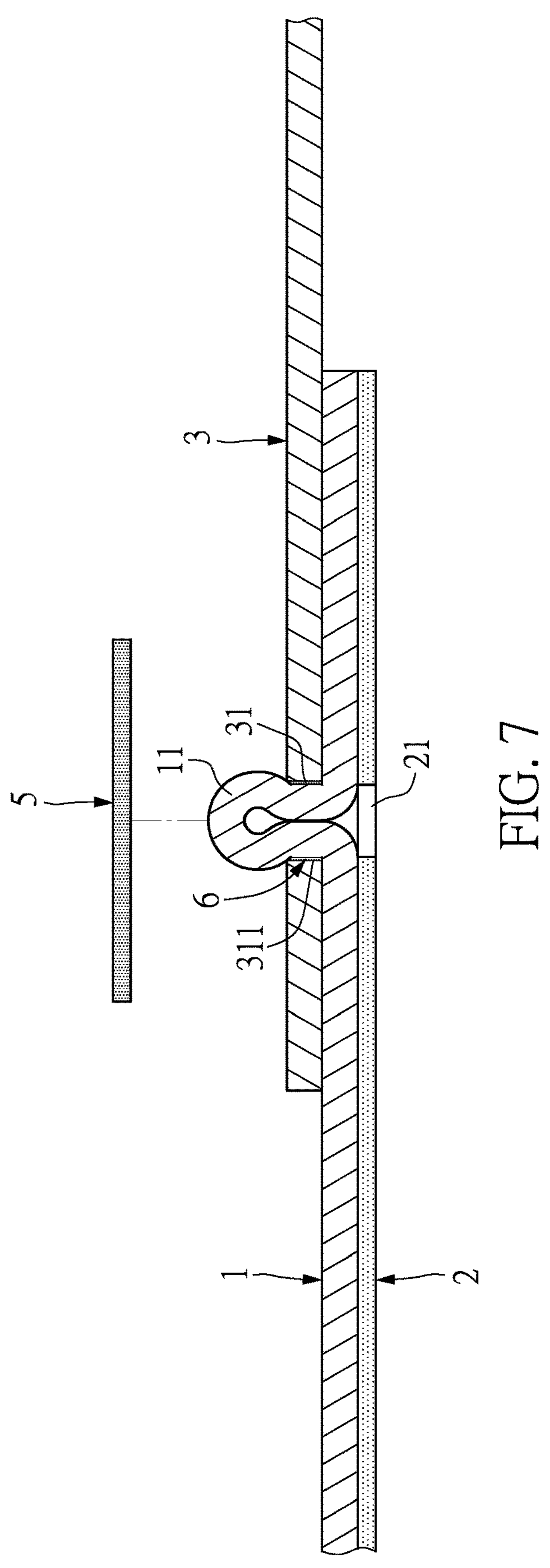
FIG. 7 is still another schematic assembly view of the connection structure for a yarn wire and a circuit board according to the present disclosure.

Afterwards, the jig 4 can be removed (as shown in FIG. 6). At this time, the yarn wire 1 recovers and expands due to the stretching being stopped, and the yarn wire 1 applies a frictional force and an abutting normal force on an inner wall 311 of a periphery of the through hole 31. Furthermore, the portion of the yarn wire 1 that passes through the through hole 31 forms a protruding wire segment 11 that is expanded so as to provide a fixing effect. The protruding wire segment 11 can be in a shape of a round loop (as shown in FIG. 6 and FIG. 7). The protruding wire segment 11 can prevent the yarn wire 1 from being pulled out together with the jig 4, so as to provide a fixing effect.

Furthermore, glue can be dispensed between the yarn wire 1 and the circuit board 3. That is, an electrically conductive adhesive 6 (e.g., a conductive silver glue) can be disposed between the yarn wire 1 and the circuit board 3 to assist in fixing the yarn wire 1 and the circuit board 3 together, so that the yarn wire 1 and the circuit board 3 can have an improved electrical conduction and an improved fixing effect.

A fixing back adhesive 5 can be adhered to one side of the circuit board 3 (as shown in FIG. 7) by way of heat-pressing. The fixing back adhesive 5 is adhered to the circuit board 3 and the protruding wire segment 11 to enable the protruding wire segment to be more rigid and difficult to be pulled out. Therefore, the yarn wire 1 and the circuit board 3 are fixedly connected to each other and achieve an electrical connection, and the metal wire of the yarn wire 1 can be in contact with the circuitry of the circuit board 3 to achieve the electrical connection. The back adhesive 2 can also be adhered to the yarn wire 1 and the circuit board 3 by way of heat-pressing.

Figure 8:
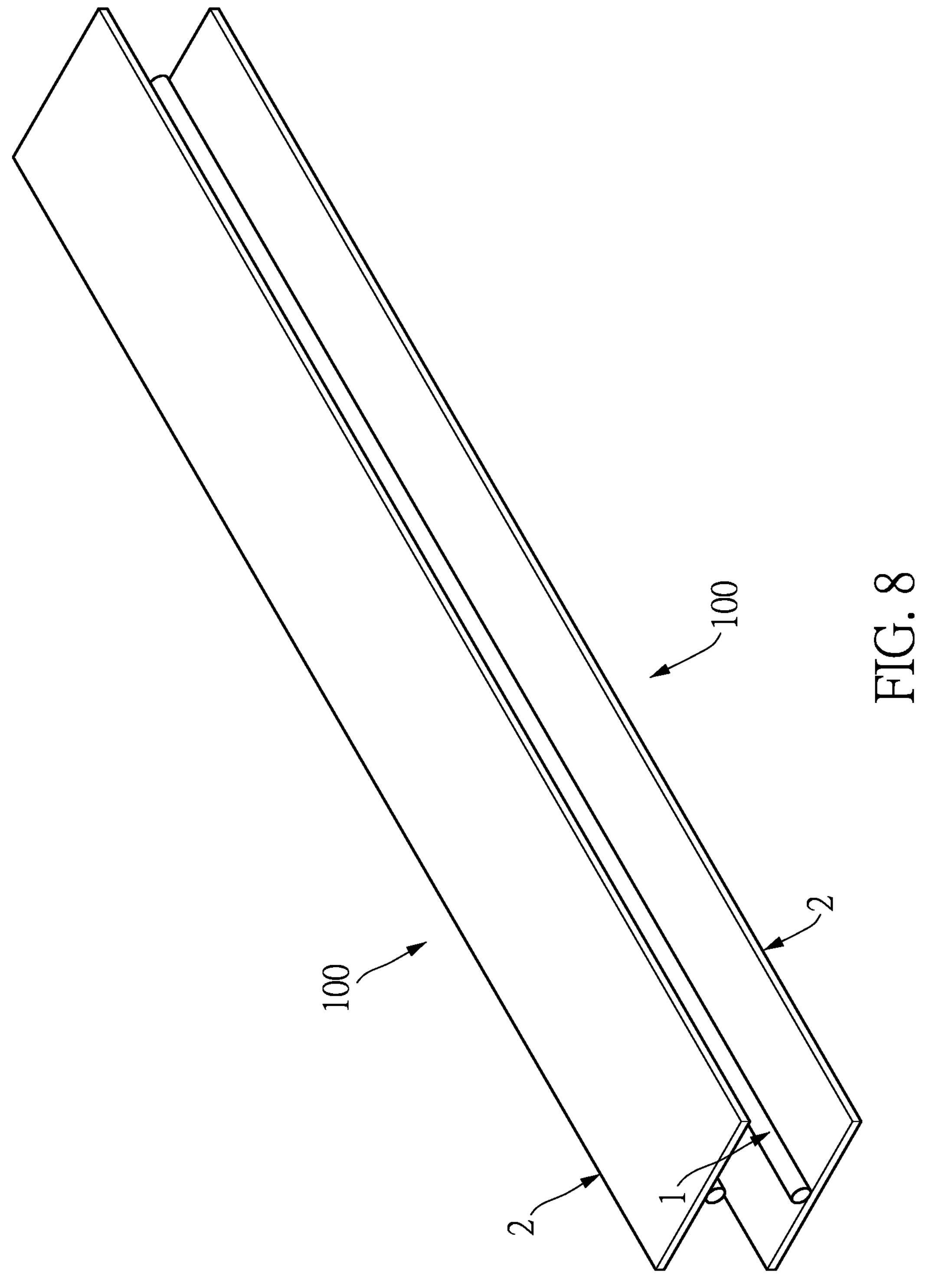
FIG. 8 is a perspective assembly view of two yarn wire groups being connected to each other according to the present disclosure.
Figure 9:
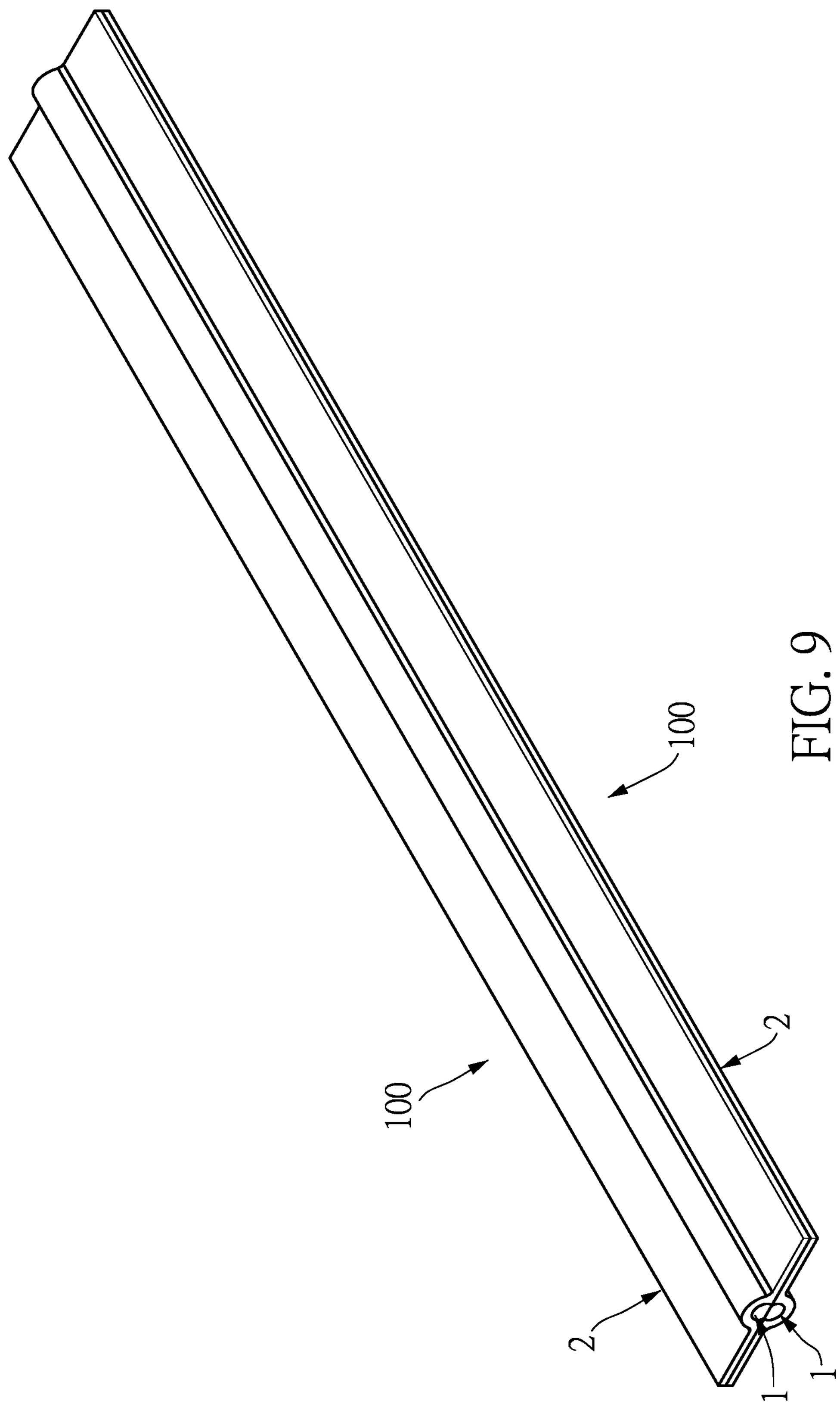
FIG. 9 is a perspective exploded view of two yarn wire groups being connected to each other according to the present disclosure.

Furthermore, as shown in FIG. 8 and FIG. 9, the yarn wires 1 and the back adhesive 2 can form a yarn wire group 100, and two yarn wire groups 100 can be in contact with each other through the back adhesive 2. Furthermore, a pressing mechanism (omitted in the figure) can be used to press the two yarn wire groups 100 so that the back adhesives 2 of the two yarn wire groups 100 are bonded together. The yarn wires 1 are exposed from one side of the back adhesive 2 in each of the two yarn wire groups 100, so that the yarn wires 1 of the two yarn wire groups 100 can be in contact with each other and form an electrical connection. The yarn wires 1 of the two yarn wire groups 100 can be connected with each other to allow the two yarn wire groups 100 to be electrically connected with each other. Therefore, two of the yarn wires 1 can be connected with each other without the need of a solder, and the connection structure can be applied to process a material that is not resistant to high temperatures (e.g., the temperature of the solder).

Figure 10:
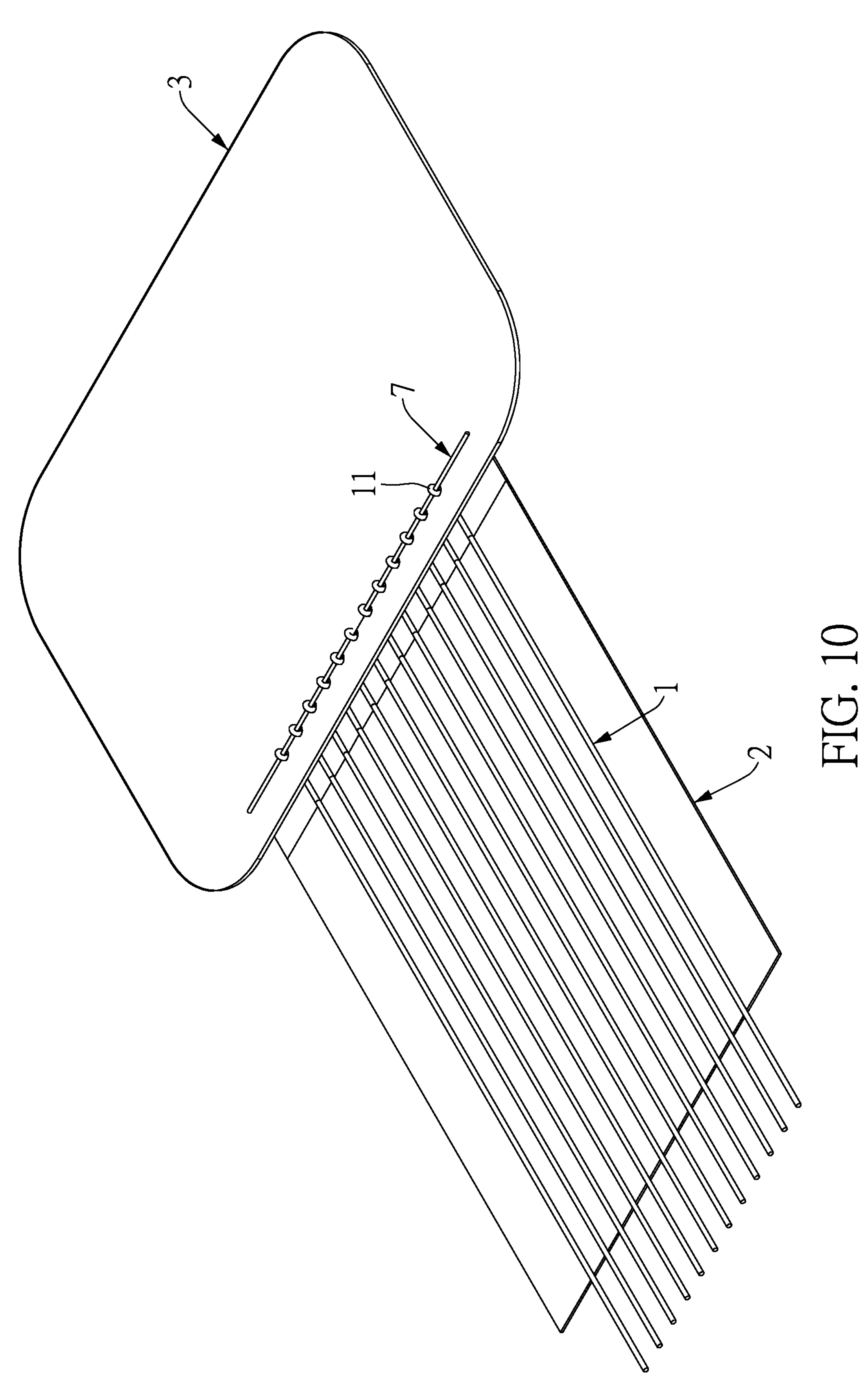
FIG. 10 is a perspective view of the connection structure for a yarn wire and a circuit board according to one embodiment of the present disclosure.

In addition, as shown in FIG. 10, this embodiment provides another structure for fixing the protruding wire segment 11. After a portion of the yarn wire 1 passes through the through hole 31 of the circuit board 3 to form the protruding wire segment 11, an insulating wire 7 (e.g., a plastic wire) penetrates into a side of the protruding wire segment 11 being loop-shaped. The insulating wire 7 passes through the center of the protruding wire segment 11 being loop-shaped as an anti-pulling support line to prevent the protruding wire segment 11 from being pulled out. Therefore, the yarn wire 1 and the circuit board 3 are fixedly connected to each other and achieve an electrical connection.

Beneficial Effects of the Embodiment

In conclusion, in the connection structure for a yarn wire and a circuit board, the connection structure includes a yarn wire, a back adhesive, and a circuit board. A through hole is formed on the circuit board, and a diameter of the through hole D, a diameter of the yarn wire d, the diameter of the yarn wire shrunken from stretching $d_{min}$, and a jig thickness t of a jig have a relation of: $2d>D>2d_{min}+t$. During assembly, the yarn wire together with the back adhesive are aligned with the through hole of the circuit board. A portion of the yarn wire is extruded into and passes through the through hole by using the jig, and the portion of the yarn wire that passes through the through hole forms a protruding wire segment that is expanded and is in a shape of a round loop. The yarn wire applies a frictional force and an abutting normal force on an inner wall of a periphery of the through hole. The protruding wire segment that is expanded can prevent the yarn wire from being pulled out together with the jig. The fixing back adhesive is adhered to the circuit board and the protruding wire segment and enables the protruding wire segment to be more rigid and is difficult to be pulled out. Therefore, the yarn wire and the circuit board are connected and fixed to each other. The connection structure of the present disclosure allows the yarn wire and the circuit board to be fixed and electrically conductive. Furthermore, the connection structure does not use a solder so that the connection structure can be eco-friendly, and the connection structure can be applied to process a material that is not resistant to high temperatures.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A connection structure, comprising:

at least one yarn wire;

a back adhesive; and a circuit board having at least one through hole penetrating through two opposite sides of the circuit board, wherein a diameter of the through hole is defined as D, a diameter of the at least one yarn wire is defined as d, a shrunken diameter of the yarn wire being stretched is defined as $d_{min}$, and a jig thickness of a jig is defined as t; wherein the diameter of the through hole, the diameter of the at least one yarn wire, the shrunken diameter of the yarn wire being stretched, and the jig thickness have a relation of: $2d>D>2d_{min}+t$;

wherein the yarn wire is arranged on the back adhesive so that the back adhesive is disposed on one side of the yarn wire, and the yarn wire is aligned with the through hole of the circuit board; wherein a portion of the yarn wire is extruded into and passes through the through hole by using the jig, and the portion of the yarn wire that passes through the through hole forms a protruding wire segment that is expanded and is in a shape of a round loop; wherein a fixing back adhesive is adhered to one side of the circuit board, and the fixing back adhesive is adhered to the circuit board and the protruding wire segment so that the yarn wire and the circuit board are connected and fixed to each other.

2. The connection structure according to claim 1, wherein the diameter of the yarn wire ranges from 0.5 mm to 0.7 mm, and the shrunken diameter of the yarn wire being stretched ranges from 0.2 mm to 0.4 mm.

3. The connection structure according to claim 1, wherein the yarn wire and the back adhesive form a yarn wire group, and two yarn wire groups are able to be bonded by contacting with each other through the back adhesive, such that the yarn wires of the two yarn wire groups are able to be electrically conductive by contacting with each other.

4. The connection structure according to claim 1, wherein at least one perforation is formed on the back adhesive, and the perforation corresponds to the through hole.

5. The connection structure according to claim 1, wherein multiple ones of the yarn wires are provided, and the yarn wires are spaced apart from each other; wherein multiple ones of the through holes are formed, the through holes are spaced apart from each other, and the through holes are arranged in a row.

6. The connection structure according to claim 1, wherein the yarn wire and the circuit board are electrically connected.

7. The connection structure according to claim 1, wherein the circuit board is partially laminated with the back adhesive so that the circuit board is bonded by adhesion to the back adhesive.

8. The connection structure according to claim 1, wherein the yarn wire is a stretchable and electrically conductive yarn wire structure.

9. The connection structure according to claim 1, wherein a conductive adhesive is provided between the yarn wire and the circuit board to assist in fixing the yarn wire and the circuit board.

10. The connection structure according to claim 1, wherein an insulating wire penetrates into a side of the protruding wire segment to prevent the protruding wire segment from being pulled out.

* * * * *